United States Patent [19]

Levine

[11] Patent Number: 4,641,963

[45] Date of Patent: Feb. 10, 1987

[54] BACK-ILLUMINATED CCD IMAGER ADAPTED FOR CONTRAST TRANSFER FUNCTION MEASUREMENTS THEREON

[75] Inventor: Peter A. Levine, Mercer County, N.J.

[73] Assignee: RCA Corporation, Princeton, N.J.

[21] Appl. No.: 729,651

[22] Filed: May 2, 1985

[51] Int. Cl.[4] .................. G01M 11/00; H01L 29/78; H01L 27/14; H01L 31/00

[52] U.S. Cl. .................................. 356/124.5; 357/24; 357/30

[58] Field of Search .................. 357/24, 30; 356/124.5

[56] References Cited

U.S. PATENT DOCUMENTS 3,925,657 12/1975 Levine ...................... 357/24 L R 4,528,596 7/1985 Cope .......................... 357/24 L R

OTHER PUBLICATIONS

Hobson *Charge-Transfer Devices* Edward Arnold, Ltd., London 1978, pp. 162–167.

*Primary Examiner*—Gene M. Munson
*Attorney, Agent, or Firm*—Eugene M. Whitacre; Paul J. Rasmussen; James B. Hayes

[57] ABSTRACT

Stripe patterns of varying spatial frequency, formed in the top-metalization of a back-illuminated solid-state imager, facilitate on-line measurement of contrast transfer function during wafer-probe testing. The imager may be packaged to allow front-illumination during in-the-field testing after its manufacture.

7 Claims, 2 Drawing Figures

BACK-ILLUMINATED CCD IMAGER ADAPTED FOR CONTRAST TRANSFER FUNCTION MEASUREMENTS THEREON

The invention described herein was made in the performance of work under NASA Contract No. NAS 5-27505 and is subject to the provisions of Section 305 of the National Aeronautics and Space Act of 1958 (72 Stat. 435; 42 U.S.C. 2457).

The invention relates to the measurement of the contrast transfer function (CTF) of back-illuminated semiconductor imagers and to back-illuminated semiconductor imagers particularly adapted to the making of such measurements on a production line basis.

BACKGROUND OF THE INVENTION

Testing of solid state imagers takes up a substantial portion of the total time needed, on average, for making each imager in mass production. Vertical and horizontal modulation transfer functions are two vital parameters to be measured. Modulation transfer function (MTF) measures the relative responses of a camera system component, such as a solid state imager, to patterns of sinusoidal intensity variation of given spatial frequency as that spatial frequency increases. Response falls off at higher spatial frequencies in a solid state imager using charge coupled devices (CCDs) for transporting charge packets descriptive of image samples owing to inefficiencies in charge transfer. Charge transfer is inefficient to the degree it is incomplete.

RCA Corporation manufactures CCD imagers that have thinned substrates of semiconductive material. These imagers are mounted on glass backing plates and are back-illuminated, which is to say the light image impinges on the substrate surface cemented to a glass backing plate by an optically transparent cement. Vertical and horizontal MTF measurements are made while the imagers are on the wafer, before being separated into individual imagers by the dicing steps preparatory to packaging. These MTF measurements have been made by projecting a test image through the front surface of the substrate—i.e., through the surface on which the CCD gate electrode structures are disposed. These gate electrodes are thin polysilicon, so light will pass through them.

Filter plates with sinusoidal variations in optical transmission are difficult to make accurately, while filter plates with alternately transparent and opaque stripes are relatively simple to make. So, in practice, modulation transfer function is calculated from measurements of contrast transfer function (CTF). Refer to *RCA Electro-Optics Handbook*, Technical Series EOH-11, Section 8.3, "MTF (Modulation Transfer Function) and CTF (Contrast Transfer Function)", pp. 114–117, published by RCA Commercial Engineering, Harrison, NJ 07029, copyright 1974. CTF measures the relative responses of a camera system component to square wave patterns of given spatial frequency and orientation. The CTF measurements are converted to MTF specifications to facilitate calculating the overall MTF of a proposed system by multiplying the respective MTFs of the optical and electrical components which are to be in cascade arrangement in the system.

Owing to MTF losses in the optical system, the front-illumination test method described above can only give an appropriate measurement of modulation transfer function and may leave subtle variations undetected. In addition accurate alignment of the pattern with respect to the pixel positions is difficult, preventing accurate automatic testing.

SUMMARY OF THE INVENTION

In a solid-state imager of back-illuminated type embodying the present invention, which includes a charge-coupled device, a selectively opaque test pattern is placed on the gate side of the imager by photolithographic steps. This test pattern is selectively illuminated. This selective front-illumination generates an image of the test pattern on the solid state imager by a process analogous to contacting printing in the photographic arts.

The test pattern is, in a preferred embodiment of the invention, provided with at least one striped region over the charge-coupled device for implementing measurements of its CTF. The test pattern in this preferred embodiment of the invention is a metal pattern formed by the same top-metalization steps used to lay down interconnection busses. The pattern is accurately registered with respect to the substrate surface by the same alignment processes associated with top-metal registration, using the conventional alignment keys between the successive masks normally used in photolithographic processes. During wafer probe testing a source of light providing a uniform field over the imager die is used to project the shadow of the striped regions in the test pattern into the imager, when CTFs are to be measured. Imager response is generated by "contact printing" of the selectively opaque test pattern, rather than imager response being generated responsive to a "projected" test pattern.

A CCD imager embodying the invention may be packaged to allow selective front illumination, so CTFs can be measured in a television camera during set-up procedures.

DETAILED DESCRIPTION

Figure 1:
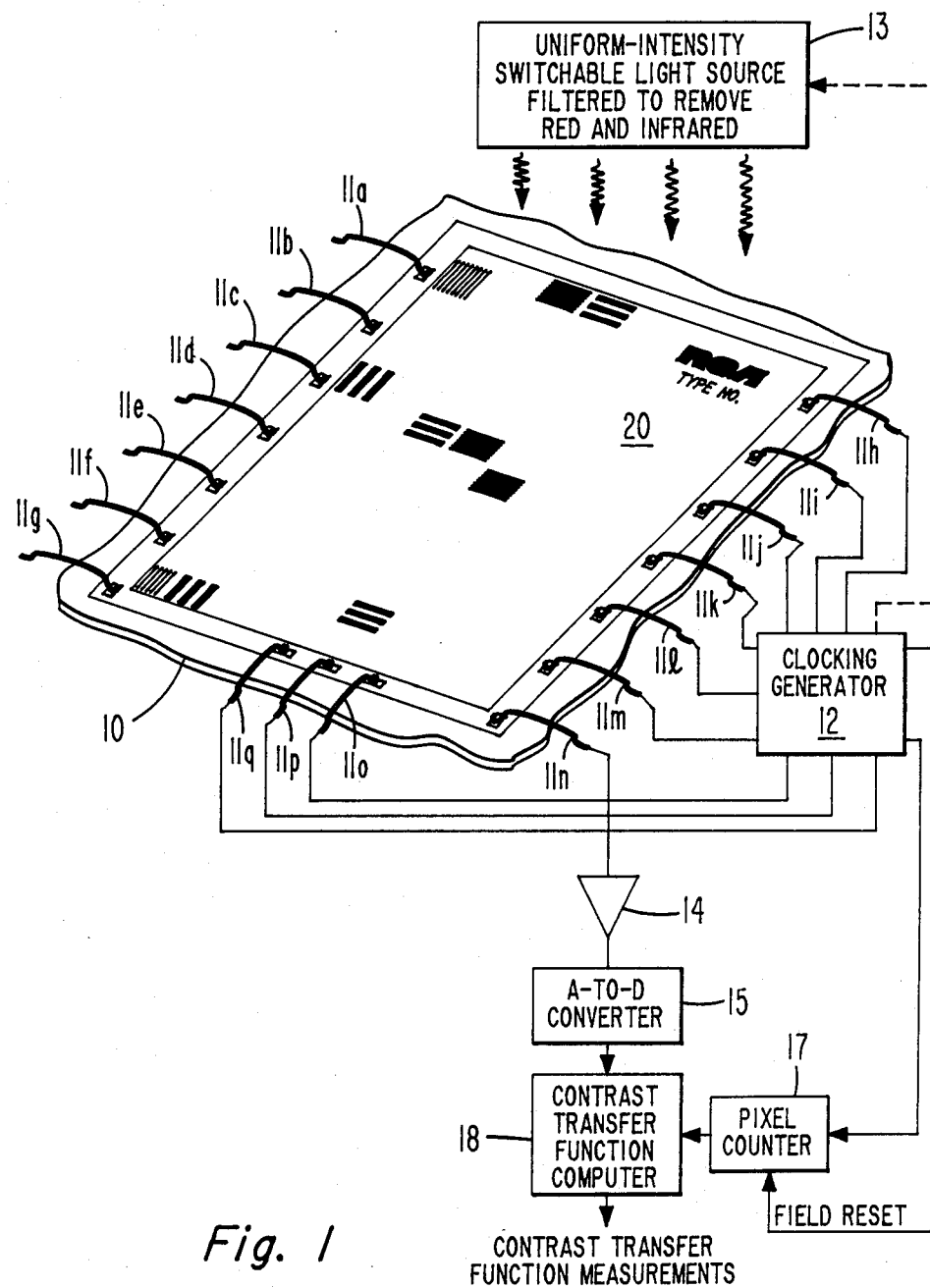
FIG. 1 is a schematic diagram of a wafer-probe testing station for measuring the CTF of a solid state imager in accordance with the invention prior to dicing and packaging operations.

In FIG. 1, a portion 10 of the semiconductive wafer bearing the solid-state imagers is positioned in a wafer-probe testing station, with electrical connections being provided by fingers 11, a through q, electrically contacting bond pads on its top (or front-illuminated) surface. Testing normally is done prior to separating the wafer into individual solid-state imager dies for packaging. Certain of the fingers, 11-*a* through 11-*g*, are for applying direct operating voltages. Finger 11-*n* conducts imager output signals. Fingers 11-*h* through 11-*m* and 11-*o* through 11-*q* are for applying clocking voltages from a clocking generator 12.

Figure 2:
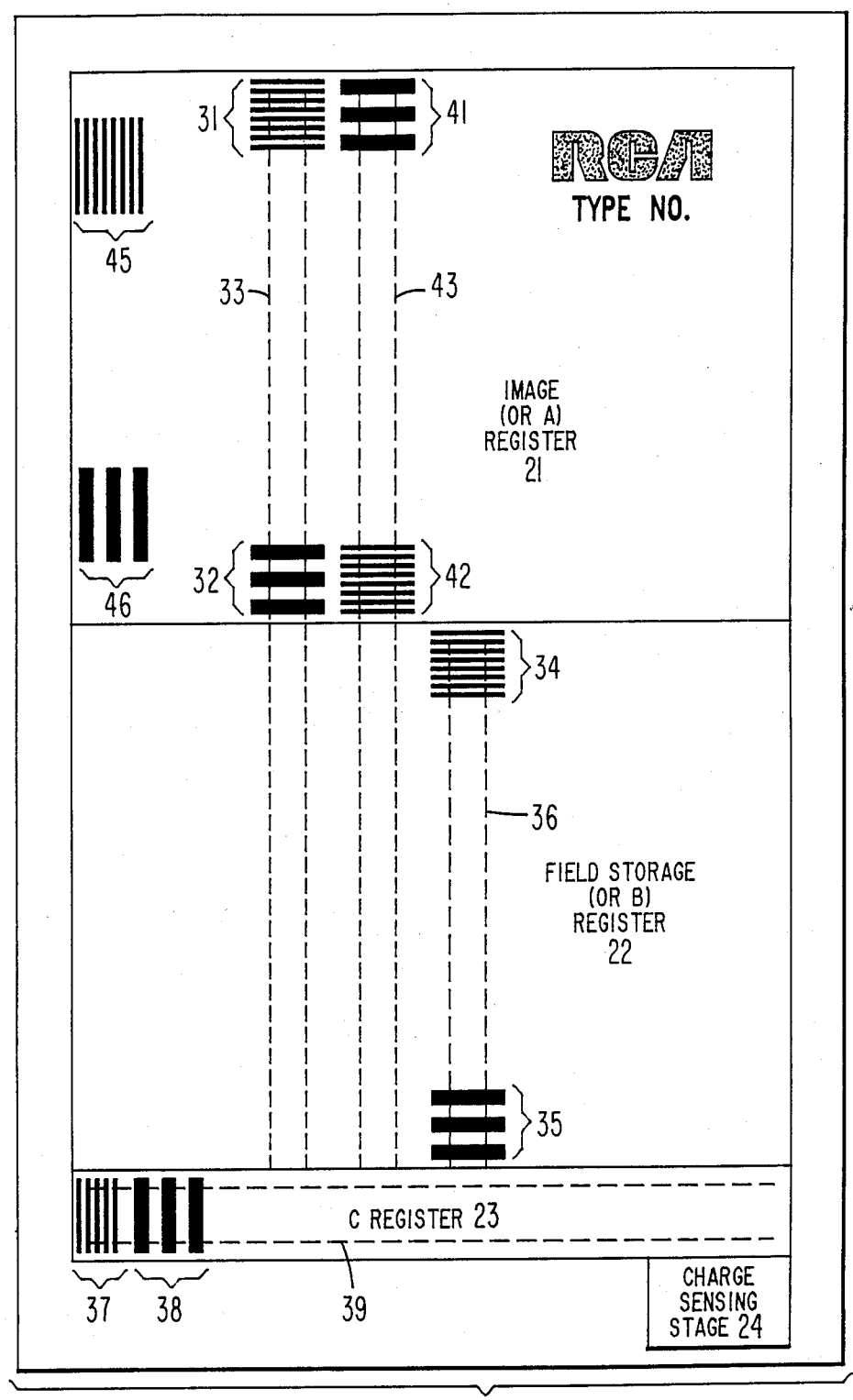
FIG. 2 is a representation of the top surface of a field transfer CCD imager bearing test pattern metalization for measuring CTF. (Bond pads and their locations are omitted.)

The solid state imager on portion 10 of the wafer is illustrated as being a field-transfer type of charge-coupled-device (CCD) imager by way of example. Such a CCD imager 20, the top (or front-illuminated) surface of which is shown in detail in FIG. 2, comprises a plurality of charge transfer channels in a parallel array 21, which functions as a back-illuminated image (or A)

register in normal operation of the imager. A further plurality of charge transfer channels is provided in a parallel array 22, which in normal operation is shielded from illumination and functions as a field storage (or B) register. A CCD output line (or C) register 23 is included in the imager to convert rows of charge packets supplied to it parallelly-in-time to a serial-in-time format. The imager 20 also has a charge sensing stage 24, which converts the serially supplied charge packets to output signal voltage samples.

A pattern 31 of high-spatial-frequency stripes and a pattern 32 of low-spatial-frequency stripes are formed in a top-metalization layer disposed across at least one charge transfer channel 33 in its image (or A) register 21. A pattern 34 of high-spatial-frequency stripes and a pattern 35 of low-spatial-frequency stripes are formed in the top-metalization layer disposed across at least one charge transfer channel 36 in its field storage (or B) register 22. A pattern 37 of high-spatial-frequency stripes and a pattern 38 of low-spatial-frequency stripes are formed in the top-metalization layer disposed across the charge transfer channel 39 of its output (or C) register 23. The charge transfer channels 33, 36, 39 etc. are each indicated by a parallel pair of dotted lines suggestive of their position below the top surface of the semiconductor substrate.

In its position in the wafer-probe testing station, a bottom surface of the wafer (portion 10 of which is shown in FIG. 1) rests on an opaque underlying support. This surface includes the bottom surface of the solid-state imager 20 under test, which imager is designed to be back-illuminated in normal operation in the field. During its testing, the solid-state imager 20 is front-illuminated through its top surface, which after dicing and packaging will be shielded from illumination. During testing a light source 13 supplies uniform-intensity illumination to the top surface of the solid-state imager 20 under test. This illumination casts the shadows of the stripes in patterns 31, 32, 34, 35, 37, 38 or any other opaque pattern, such as the RCA logotype, into the bulk semiconductor of imager 20. Photoconversion of the selectively transmitted illumination generates within imager 20 charge transfer channels a pattern of charge packets forming what is in effect a "contact print" of the opaque patterns. So that photoconversion takes place primarily in the charge transfer channels of the CCD imagers, rather than the underlying bulk semiconductor, light source 13 is filtered to remove red and infrared components. Of course, alternatively, source 13 may be provided by a light source inherently strong in the green or blue portions of the spectrum to avoid need for chromatic filtering. One may arrange for light source 13 to be switched on and off responsive to synchronizing signals supplied thereto from clocking generator 12 via a connection 19.

When CTF measurements of B register 22 are made using stripe patterns 34 and 35, or when CTF measurements of C register 23 are made using stripe patterns 37 and 38, it is necessary to make light source 13 a switched or stroboscopic light source and to exclude other illumination from the solid-state imager 20 under test. Light source 13 is switched on for a time, while all clocking of solid-state imager 20 is halted to accumulate substantial charge in the storage wells in A register 21, in B register 22, and in C register 23. Then the light source 13 is switching off, and normal field transfer imager clocking is resumed.

Alternatively, one may arrange to make a low-spatial-frequency (dc) response measurement without having to use a striped pattern. Light source 13 is switched on and charge packets are integrated in A register 21. These charge packets are then transferred to charge sensing stage 24 and sensed. The measurement is temporarily stored within computer 18. Light source 13 is switched off and charge packets attributable to dark current only are integrated in A register 21. These charge packets are transferred to charge sensing stage 24 and sensed. The measurement is subtracted from that data temporarily stored in computer 18 to provide a low-spatial-frequency (dc) response measurement corrected for dark current and clocking noise.

One can also arrange, if CTF measurements of just the A register 21 and B register 22 cascade are to be made, for light source 13 to be continuously on and for the solid state imager 20 to receive conventional clocking signals for a field transfer imager. This is because the A register 21 clocking is for the most part static, so there is plenty of time for the accumulation of charge carriers generated by light passing through the interstices of stripe patterns atop the A register 21. In principle, measurements of the CTF of B register 22 and the CTF of C register 23 using charge packets integrated under stripe patterns (e.g. 31, 41) atop the A register 21 could also be made without interrupting light source 13 or normal field transfer CCD imager clocking. Such measurements will be described later on in this specification.

The finger 11-n supplies output signal samples from the charge sensing stage of the semiconductor imager under wafer-probe test to a video amplifier 14. Video amplifier 14 supplies amplified response to these samples to an analog-to-digital converter 15, which digitizes their intensity. These sample data are supplied to a computer 18 which computes contrast transfer function measurements, or modulation transfer function measurements, or both. A counter 17 counts the pixels in each field to identify to computer 16 the pixels whose intensity information is currently supplied by A-to-D converter 15. Computer 18 may be provided information as to the number of charge transfers made in each of the A, B and C registers of the CCD imager 20 under test, so that CTF measurements and MTF calculations can be normalized into per charge transfer units. This facilitates calculating MTF and CTF for different portions of the imagers by inferential processes.

In computer 18 the maximum and minimum pixel intensities for photoresponse originating in the portions of the charge transfer channel under pattern 38 are determined, and the latter is subtracted from the former to obtain C register 23 response to low-spatial-frequency illumination. Then, the maximum and minimum pixel intensities for photoresponse originating in the portions of the charge transfer channel under pattern 37 are determined, and the later subtracted from the former to obtain C register 23 response to high-spatial-frequency illumination. Computer 18 determines the ratio of the C register response to high-spatial-frequency illumination to its response to low-spatial-frequency illumination to measure C register 23 CTF. With stripe patterns 37 and 38 in the order shown, this can be done by, firstly, dividing the charge sensing stage 24 response to charge packets originating under low-spatial-frequency stripe pattern 38 by response to charge packets originating under high-spatial-frequency stripe pattern 37 and, secondly, calculating the reciprocal of the quotient. Computer 18 may also be equipped to obtain C register 23 MTF from its CTF. In such case several stripe patterns of different respective spatial frequencies are used in addition to patterns 37 and 38 so the CTF characteristic of the solid-state imager 20 under test is better sampled.

Computer 18 repeats the above process, but for pixel intensities originating in the charge transfer channel 26 under patterns 34 and 35, to measure the CTF of B register 22. Computer 18 may also infer the MTF of B register 22.

In analogous processes, computer 18 may utilize the pixel intensities originating under patterns 31 and 32 to measure the CTF of the A register 21 and B register 22 register combined. Computer 18 may also infer their combined MTF and using that MTF with the MTF of the B register calculate the MTF of the A register alone and, if desired, the CTF of the A register alone. (The MTF of a cascade of elements in an optical and electrical system is the product of the MTFs of the individual elements, it is well known.)

As noted before, the measurement of the CTF of the A register 21 and B register 22 combined can be made with a constant-illumination light source 13. Referring back to FIG. 2 additional stripe patterns 41, 42, 45, 46 are shown which permit measurements of the CTFs of B register 22 and C register 23 with a constant-illumination light source 13. The additional stripe patterns 41, 42 also permit a measurement of A register 21 CTF that is in some ways more direct than that previously described.

The location of a high-spatial-frequency pattern, such as 31 or 34 near the beginning of a charge transfer channel in a register and the location of a low-spatial-frequency pattern, such as 32 or 35, near the ending of that charge transfer channel in that register is done presuming that charge transfer of low-spatial-frequencies is done on an essentially lossless basis. The high-spatial-frequency pattern 31, 34, 37 is located as close to the beginning of the charge transfer channel the beginning of the charge transfer channel the stripes cross as is possible, so the passage of the charge packets with high spatial-frequency content is over as great a length of charge transfer channel as possible, to make loss of high-spatial-frequency content as large as possible and increase the sensitivity of CTF measurement. The foregoing presumption is valid unless there is clearly something defective with the CCD imager 20 under test. The response of charge sensing stage 24 to charge packets originating under low-spatial-frequency stripe pattern 32 at the ending of charge transfer channel 33 in A register 21 is compared in computer 18 to the response to charge packets originating under low-spatial-frequency stripe pattern 41 at the beginning of charge transfer channel 43. If the responses are substantially the same, the CCD imager 20 is no so defective as not to warrant being tested further.

To measure A register 21 CTF in the somewhat more direct method previously alluded to, computer 18 subtracts the response of charge sensing stage 24 to charge packets originating under high-spatial-frequency stripe pattern 42 at the ending of charge transfer channel 43 in A register 21 from the response to charge packets originating under high-spatial-frequency stripe pattern 31 at the beginning of charge transfer channel 33. Presuming charge transfer efficiencies to be essentially the same in charge transfer channels 33 and 43, which is a reasonably safe presumption to make, the resulting difference describes the loss of high-spatial-frequency response in the transfer of charge packets the length of A register 21, owing to inefficiencies of charge transfer. Computer 18 divides this difference, then, by the response to low-spatial frequency pattern 41 to calculate A register 21 CTF.

To measure B register 22 CTF with constant front-illumination of A register 21 from light source 13, one relies on A register 21 clocking controlling the image integration times for the accumulation of charge packets under stripe patterns 32 and 42. These patterns being close to the ending of charge transfer channels 33 and 43 in A register 21 and their beginnings in B register 22, the response of charge sensing stage 24 to the charge packets accumulated under them as a function of vertical spatial frequency is primarily affected by B register 22. This is because the preponderance of the successive charge transfers affecting charge transfer efficiency and CTF measurements take place in B register 22, rather than in A register 21. Computer 18 divides the charge sensing stage 24 response to charge packets originating under high-spatial-frequency stripe pattern 42 by the response to charge packets originating under low-spatial-frequency stripe pattern 32 to calculate B register 22 CTF.

Consider now the measurement of C register 23 CTF, using stripe patterns 45 and 46, and continuously front-illuminating A register 21 with light source 13. The stripe patterns are preferably located on the side of A register 21 top surface transferring charge packets to the beginning of charge transfer channel 39 during normal field transfer clocking operations. The stripes of high spatial frequency in pattern 45 overlie individual alternate charge transfer channels in A register 21, for example, and the stripes of low spatial frequency in pattern 46 each overlie a respective group of contiguous charge transfer channels in A register 21. There are the same number of contiguous charge transfer channels in each group, and side-by-side stripes are separated by a space that overlies a similar number of contiguous charge transfer channels as in one of the groups of charge transfer channels under a stripe. The stripes in patterns 45 and 46 are made of sufficient length that they are low-spatial-frequency in the direction perpendicular to line scan, so the MTFs of the A register 21 and B register 22 (which have frequency response roll-off in the direction of line scan) do not affect C register 23 CTF measurements. Computer 18 calculates C register 23 CTF by dividing charge sensing stage 24 response to charge packets originating under low-spatial-frequency stripe pattern 46 by response to charge packets originating under high-spatial-frequency stripe pattern 45, and then calculating the reciprocal of the quotient.

It should be appreciated that rather than using only two stripe patterns of differing spatial frequency in the measurement of the CTF of A register 21, B register 22, or C register 23, a greater number of stripe patterns of different spatial frequencies may be used. It should also be appreciated that the CTF of other CCD devices, including other types of CCD imagers or solid state imagers incorporating CCDs, can be carried out using methods similar to those specifically described for testing field transfer type CCD imagers.

In normal packaging of the back-illuminated solid-state imager, the front of the imager (its top surface during wafer probe) is shielded from illumination. One may arrange to use a package with a window allowing selective front-illumination of the imager when it is situated in a television camera. This can facilitate in-the-field MTF measurements of the imager in accordance with the invention, as well as MTF measurements of all following apparatus in the camera chain. Also, other patterns such as trademark and type number designations can be put into the metalization, to facilitate identifying the imager either visibly or through electrical response during front-illumination. The selectively opaque patterns may be made other than in the top-metalization layer. For example, dyes may be introduced into or onto the top polysilicon layer to selectively absorb and transmit selected wavelengths of illumination according to a pattern. Dyes opaque at different wavelengths and different colors of front-illumination can be used to select between or amongst different patterns for "contact printing."

What is claimed is:

1. A solid state imager of back-illuminated type, including a charge coupled device with gate electrodes disposed on a first surface of said imager opposite to a second surface thereof through which said imager receives back-illumination under normal circumstances and having a selectively opaque optical pattern disposed over the first surface of said imager, said pattern comprising at least one stripe pattern of specific spatial frequency overlying a charge transfer channel of said charge coupled device, said stripes cross the width of said charge transfer channel, and being arranged in combination with:

means providing illumination to said first surface of said solid state imager for causing a shadow of said selectively opaque optical pattern to form on said charge transfer channel;

means for applying clocking voltages to the said charge coupled device; and means for utilizing the output signal from said imager, said output signal being responsive to the illumination of the first surface as selectively transmitted by said selectively opaque optical pattern, for calculating the contrast transfer function of said charge transfer channel.

2. A combination as set forth in claim 1 including:

means temporarily shielding the second surface of said solid state imager from illumination, while illumination is provided to said first surface, for causing a "contact print" of said optical pattern to form in said charge-coupled device.

3. A combination as set forth in claim 2 wherein each said stripe pattern is disposed in a top-metalization layer over the first surface of said imager.

4. A combination as set forth in claim 2 wherein said optical pattern contains at least one stripe pattern of specific spatial frequency that overlies a first portion a charge transfer channel of said charge-coupled device followed in succession by a second portion of said charge transfer channel, so the stripes therein cross the width of said first portion of said charge transfer channel; and wherein said means for utilizing the output signal from said imager includes means for calculating the contrast transfer function of the second portion of the charge transfer channel of said charge coupled device.

5. A combination as set forth in claim 4 wherein each said stripe pattern is disposed in a top-metalization layer over the first surface of said imager.

6. A combination as set forth in claim 2 wherein said charge coupled device contains a plurality of parallelled charge transfer channels having output ends connected to respective ones of the successive charge transfer stages in a further charge transfer channel; wherein said optical pattern contains at least one stripe pattern of specific spatial frequency with stripes overlying portions of selected ones of said parallelled charge transfer channels; wherein forward clocking voltages are applied only during intermittent intervals to the gate electrodes overlying said parallelled charge transfer channels in at least those portions of those charge transfer channels over which extends each of said stripes and each space between adjacent ones of said stripes;

wherein the gate electrodes over said further charge transfer channel receive forward clocking voltages during times between those intermitted intervals; and wherein said means for utilizing the output signal from said imager includes means for calculating the contrast transfer function in said further charge transfer channel.

7. A combination as set forth in claim 6 wherein each said stripe pattern is disposed in a top-metalization layer over the first surface of said imager.

* * * * *